Sept. 9, 1969 R. S. SPRIGGS ET AL 3,465,428

METHOD OF FABRICATING SEMICONDUCTOR DEVICES AND THE LIKE

Filed Oct. 27, 1966

Rueben S. Spriggs,
Arthur J. Learn,
John A. Scott-Monck,
INVENTOR.

BY

Jerry A. Dinardo

AGENT 3,465,428

METHOD OF FABRICATING SEMICONDUCTOR DEVICES AND THE LIKE

Rueben S. Spriggs, San Pedro, Arthur J. Learn, Torrance, and John A. Scott-Monck, Redondo Beach, Calif., assignors to TRW Inc., Redondo Beach, Calif., a corporation of Ohio Filed Oct. 27, 1966, Ser. No. 590,054
Int. Cl. B01j *17/00;* H01l *7/02*
U.S. Cl. 29—589 21 Claims

ABSTRACT OF THE DISCLOSURE

A method of fabricating thin film semiconductor devices by vacuum depositing a layer of polycrystalline semiconductor material onto an ohmic contact layer previously deposited onto a substrate. The layered structure is then immersed in hot silicone oil for a time sufficient to cause heat-treatment of the structure prior to further operations required to produce a completed device.

This invention relates to improvements in the art of fabricating solid state devices, and more particularly to an improved method of manufacturing solid state devices of the thin film variety, by reason of which method increased barrier height and rectification ratio may be achieved.

To illustrate, a solid state diode consists of a semiconductor, a first non-ohmic or blocking contact, and an ohmic contact. According to well-known simple work function theory, on n-type semiconductors a metal of low work function provides the ohmic contact while a metal of high work function provides the blocking contact. The blocking contact is so-called because current carriers cannot be freely injected therefrom into the semiconductor. This arises from the existence of an energy or electrical potential barrier at the interface between the semiconductor and the blocking contact.

In order for a substantial density of current carriers to surmount this energy barrier, an amount of energy must be provided to the carriers, as for example by the direct application of an electrical potential. This amount of energy is generally called the barrier height and most frequently is specified in electron-volts.

It is well-known that current rectification can occur in a solid state diode of the kind described above. The rectification ratio, or the ratio of forward to reverse current for equal voltages of opposite sign, must be large to render the device useful for rectification purposes. Generally, the forward current, or the current in the easy direction of current flow, is primarily determined by the bulk resistance of the semiconductor. The reverse current is primarily determined by the barrier height. In general, the larger the barrier height, the smaller will be the reverse current, and therefore the larger will be the rectification ratio.

Heretofore, thin film semiconductive diodes, wherein the semiconductive film is polycrystalline in nature, have exhibited rectifying properties that are inferior to those of semiconductive diodes in which the semiconductor is made of single crystal material. The inferior behavior of the thin film diode is generally attributed to the poor quality of the barrier. That is, the barrier height is relatively low.

In accordance with the invention, improved thin film semiconductive devices have been made by a process which includes heat treatment of the thin film semiconductor.

A preferred form of the invention includes the steps of vacuum depositing a first metal or ohmic contact layer on a substrate, and then vacuum depositing a layer of polycrystalline semiconductive material on the ohmic contact layer. The layered structure is then removed from the vacuum chamber and immersed in hot silicone oil maintained at a temperature substantially within the range of 275° C. to 400° C. for a period of about an hour.

After the layered structure has been heat treated, it is removed from the oil and washed with a solvent to remove the excess oil. A second metal, blocking contact layer is then vacuum deposited on the semiconductive layer to complete the diode structure.

According to an alternate form of the process, the three layers of the diode structure are deposited first and then the three layered structure is subjected to heat treatment in a similar manner as above-described. While the latter form of the method produces diodes which have substantially larger barrier heights and rectification ratios than diodes made without heat treatment, it has been found that diodes made in accordance with the first form of the invention have still larger barrier heights and rectification ratios.

Other objects and features of this invention and a better understanding thereof may be had by referring to the following description and claims, taken in conjunction with the accompanying drawing in which:

Figure 1:
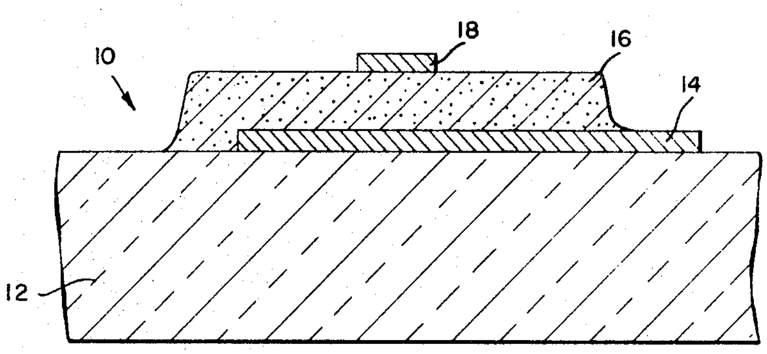
FIGURE 1 is an enlarged cross-sectional view of a thin film semiconductive diode made according to the method.

Referring to FIGURE 1, a thin film semiconductive diode 10 includes a substrate 12 of electrical insulation material, such as Pyrex glass or quartz, a first thin film metal layer 14, a thin film semiconductive layer 16, and a second thin film layer 18, arranged in that order. The first metal layer 14 forms an ohmic contact with the semiconductive layer 16 and the second metal layer 18 forms a blocking contact with the semiconductive layer 16. The metal layers 14 and 18 are preferably applied as strips crossing normal to each other.

When the semiconductive layer 16 is made of n-type semiconductive material, such as cadmium sulfide, the ohmic contact layer 14 is made of low work function metal and the blocking contact layer 18 is made of high work function metal. Examples of metals with low work function suitable for the ohmic contact layer 14 are aluminum, indium, and chromium. Examples of metals with high work function suitable for the blocking contact layer 18 are gold, platinum, palladium, nickel, silver and copper.

In accordance with a preferred embodiment of the process of the invention, the ohmic contact layer 14 is first vacuum deposited on a cleaned and polished substrate 12. A vacuum pressure of the order of less than $10^{-6}$ torr is preferred. The ohmic contact layer 14 is deposited to a thickness of 1000 angstroms or greater, with the substrate 12 at room temperature.

The next step in the process consists of vacuum depositing the semiconductive layer 16 on the ohmic contact layer 14. When using cadmium sulfide, the semiconductive layer 16 is deposited to a thickness of 2 to 3 microns while the substrate 12 is heated at 175° C.

It has been found desirable to heat the substrate 12 while depositing the semiconductive layer 16 in order to achieve high resistivity in the latter and to obtain a depletion region of substantial width. A deposition rate of about 10 angstroms per second has been used successfully with a substrate temperature of 175° C. These conditions of deposition has resulted in the production of n-type semiconductive films which exhibit preferred orientation, with the c-axis nearly normal to the substrate surface, and with film resistivity of the order of $10^4$ ohm-centimeters. Preferred c-axis orientation and resistivity both decrease with decreased substrate temperature and/or increased deposition rate.

A preferred vapor deposition source for evaporating cadmium sulfide and other crystalline powders is disclosed in copending application of Reuben S. Spriggs, et al., Ser. No. 553,981, filed May 31, 1966, now Patent No. 3,405,251, and entitled "Vacuum Evarporation Source." The thin film semiconductive layer 16 formed by vacuum deposition is polycrystalline in structure as contrasted with single crystal semiconductors.

The above-formed structure is then removed from the vacuum deposition apparatus for treatment of the semiconductive layer 16. The treatment consists of submerging the layered structure in hot silicone oil such as tetramethyltetraphenylsiloxane. A preferred temperature of the silicone oil for treatment for cadmium sulfide is about 300° C., although any temeprature within the range of 275° C. to 400° C. has been found to be satisfactory. Temperatures below 275° C. show no significant improvement in barrier height, while at temperatures above 400° C., the cadmium sulfide experiences deleterious changes. The heat treatment step is carried out for about an hour.

Following the heat treatment, the layered structure is removed from the hot oil, allowed to cool, and then washed with a solvent, such as oxylene or acetone to remove the excess oil.

The treated structure is then returned to the vacuum deposition apparatus, and the blocking contact layer 18 is vacuum deposited on the semiconductive layer 16. The blocking contact layer 18 is deposited to a thickness of 100–3000 angstroms. While the blocking contact layer 18 is deposited, the substrate 12 is at room temperature.

Diode structures have been made according to the invention in which the crossing strips making up the two metal layers 14 and 18 form cross-over areas of either 0.1 $cm.^2$ or 0.01 $cm.^2$.

Thin film diodes made according to the above-described method steps exhibit rectification ratios as high as $10^7$:1 at two volts. Optical studies performed on the diodes reveal a barrier height of approximately 1.1 electron volts. The barrier height is found to be essentially the same for blocking contact layers made of high work function metals such as gold, platinum, palladium, nickel, silver or copper.

While it is not understood what phenomenon is taking place in the thin film structure as a result of the hot oil treatment, two possible theories are suggested. One possibility is that a thin layer of silicone oil may be absorbed or chemi-sorbed on the surface of the cadmium sulfide. Such an insulating layer between the semiconductor and the blocking contact metal would form a heterojunction type diode. Another possibility is that the silicone oil or its oxygenated fragments may enter directly into some surface state phenomena.

In accordance with an alternate process, the layers 14, 16 and 18 of the diode 10 are first vacuum deposited in that order on the substrate 12, and then the three layered structure is subjected to the hot oil treatment as previously described. In this process, the diodes are treated in hot silicone oil at 300° C. for times ranging from 5–10 minutes for a blocking contact layer of 100 angstroms thickness, to 30–60 minutes for a blocking contact layer of 1000 angstroms thickness. According to this process, rectification ratios as high as $10^5$ to 1 at 1 volt have been achieved.

In the table below are presented the values of barrier heights for sample diodes using different metals for the blocking contact layer and formed in accordance with the last described process. The first column of barrier heights, entitled "Initial" refers to thin film diode samples tested prior to hot oil treatment. The second column entitled "Post-Treated" refers to thin film diode samples tested after the hot oil treatment. The thin film results are an average of at least 4 samples. The third column entitled "References" refers to results, published by others, of metal contact to vacuum cleaved single crystal cadmium sulfide. Single crystal results for all the listed metals except palladium and chromium have been published in an article by W. G. Spitzer and C. A. Mead, Journal of Applied Physics, vol. 34, page 3061, dated 1963. Single crystal results for palladium have been published by A. M. Goodman, in the Journal of Applied Physics, vol. 35, page 573, dated 1964.

TABLE OF BARRIER HEIGHTS (IN ELECTRON VOLTS)

| Metal | Initial | Post-treated | References |
|---|---|---|---|
| Pt | 0.61±0.02 | 0.88±0.04 | 0.85±0.03 |
| Au | 0.60±0.02 | 0.77±0.03 | 0.77±0.02 |
| Pd | 0.50±0.02 | 0.67±0.02 | 0.60±0.03 |
| Ag | 0.42±0.02 | 0.69±0.02 | 0.56±0.02 |
| Ni | <0.3 | 0.50±0.04 | 0.45±0.05 |
| Cu | 0.40±0.03 | 0.75±0.03 | 0.36±0.02 |
| Cr | Ohmic | Ohmic | ---------- |
| Al | Ohmic | Ohmic | Ohmic |
| In | Ohmic | Ohmic | Ohmic |

The term "Ohmic" appearing in the results for chromium, aluminum, and indium indicate that no barrier height was measurable. The table shows that thin film diodes that are subjected to heat treatment according to the method of the invention exhibit barrier heights at least as high as those of single crystal diodes, while thin film diodes that are not subjected to heat treatment according to the invention generally exhibit barrier heights that are smaller than those of single crystal diodes.

Figure 2:
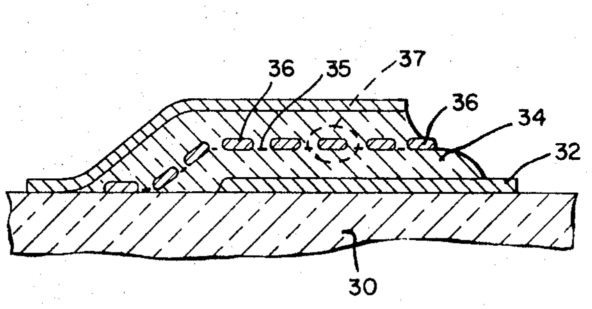
FIGURE 2 is a similar view of a gridded triode according to the method.

The inventive process described above in connection with diodes is a great improvement wherever metal is to be deposited or is applied in any manner to a semiconductor surface. For example, in FIGURE 2 there is shown a gridded triode of the sort described and claimed in U.S. patent application Ser. No. 368,811, entitled "Method of Forming Mesh-Like Structure and Article Produced Thereby," filed May 20, 1964, now Patent No. 3,355,320, in the names of Reuben S. Spriggs and Arthur J. Learn. The triode of FIGURE 2 is fabricated by thin-film techniques on an insulating substrate 30, beginning with a conductive metallic contact 32, followed by a first layer of semiconductor 34 (preferably CdS). The semiconductor layer 34 is usually deposited in ohmic contact with the first contact, so that it acts as the cathode film of the device.

Next a metallic control grid 36 is laid on top of the first semiconductive layer 34, the top surface of which is defined by the dotted lines 35. Rather than ohmic contact, blocking contact is necessary between the grid 36 and the semiconductor 34. This blocking contact is achieved by creating a large depletion region in the semiconductor surrounding grid 36. The principles of this invention have worked very well in this respect, and in addition heat treatment in silicone oil has been found to provide better definition and reproducibility of the grid 36 than was heretofore possible.

Thus, an improved triode or other gridded device may be produced by a process or method similar to that of U.S. application Ser. No. 368,811 (referred to above) and also including the steps of heat treatment and application of silicone oil before or after the laying of the grid 36 on the semiconductor 34, thereby increasing the semiconductor-metal barrier height at 35 and resulting in a wider depletion layer around the grid 36. As stated above, these steps would preferably be accomplished simultaneously by the application of heated silicone oil to the semiconductor surface either to prepare it for receiving the grid or after the grid is applied. An overall triode process would then include depositing a first conductive film on a substrate, depositing a first layer of predetermined thickness of semiconductive material on said conductive film, producing a multiplicity of tiny agglomerates of a first material on said semiconductive layer, said agglomerates being spaced apart a distance substantially equal to said predetermined thickness, filling the voids between said agglomerates with a metallic material to a depth less than the thickness of said agglomerates, removing said agglomerates to leave said metallic material formed into a mesh-like grid, heat treating said semiconductive layer, applying silicone oil to the semiconductive layer at substantially the same time as the step of heat treating the semiconductor is performed, depositing a second layer of semiconductive material on said grid of a thickness substantially greater than said predetermined thickness, and depositing a second conductive film on said second semiconductive layer.

Figure 3:
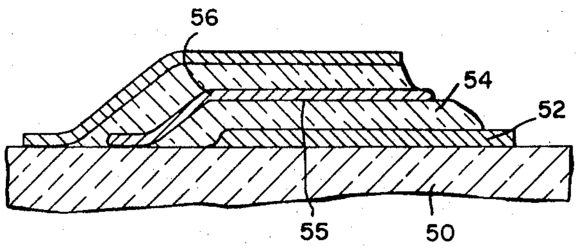
FIGURE 3 is a similar view of a metal base transistor according to the invention.

Referring to FIGURE 3, a metal base transistor or any other thin-film active element according to this invention is made by a process which includes preparing a substrate 50 of Pyrex glass, quartz, or the like, then depositing a first metal film 52 thereon. The metal film 52 is the input electrode of the metal base transistor of FIGURE 3. A first layer of semiconductor 54 is then deposited upon the metal film 52 in ohmic contact, as with the triode of FIGURE 2. Rather than laying a grid 36 upon the semiconductor, however, a solid metal film 56 is applied, using the inventive method of heat treatment in silicone oil to achieve a blocking contact at the boundary 55. Thereafter a second semiconductor layer and a metallic collector layer are applied, to complete the metal base transistor. This FIGURE 3 component has the low input impedance characteristic of transistors, rather than the high input impedance exhibited by the FIGURE 2 triode.

A number of alternative arrangements will readily suggest themselves to those skilled in the art. However, although the invention has been described with a certain degree of particularity, it is to be understood that the present disclosure has been made only by way of example and that numerous changes in the details of construction and the combination and arrangements of parts may be resorted to without departing from the spirit and the scope of the invention as hereinafter claimed.

The embodiments of the invention in which an exclusive property or privilege is claimed are defined as follows:

1. A method of fabricating solid state devices comprising the steps of:
(a) applying an ohmic contact to one side of a layer of polycrystalline semiconductive material;
(b) heating said semiconductive layer in a bath of silicone oil; and
(c) applying a blocking contact to the other side of said semiconductive layer.

2. The invention according to claim 1, wherein said heating step is performed before said blocking contact is applied.

3. The invention according to claim 1, wherein said heating step is performed after said blocking contact is applied.

4. A method of fabricating a solid state device, comprising:
(a) depositing a thin film of low work function metal on a substrate;
(b) depositing a thin film of cadmium sulfide on said metal film;
(c) depositing a thin film of high work function metal on said cadmium sulfide film;
(d) and heating said cadmium sulfide film in silicone oil at such temperature and for such time as to increase the barrier height of said device.

5. The invention according to claim 4, wherein said low work function metal is selected from the class consisting of aluminum, indium, and chromium.

6. The invention according to claim 4, wherein said high work function metal is selected from the class consisting of gold, platinum, palladium, nickel, silver and copper.

7. The invention according to claim 4, wherein said cadmium sulfide film is heated in tetramethyltetraphenylsiloxane at a temperature substantially in the range of 275° C. to 400° C. for a period of from 5–60 minutes.

8. The invention according to claim 4, wherein said heating step is performed before said high work function metal is deposited.

9. The invention according to claim 4, wherein said heating step is performed after said high work function metal is deposited.

10. The invention according to claim 4, wherein said low work function metal is deposited to a thickness of 1000 angstroms or greater.

11. The invention according to claim 4, wherein said cadmium sulfide is deposited to a thickness of 2 to 3 microns.

12. The invention according to claim 4, wherein said high work function metal is deposited to a thickness of 100 angstroms or greater.

13. A method of forming a thin film electronic device, comprising:
depositing a first conductive film on a substrate;
depositing a first layer of predetermined thickness of semiconductive material on said conductive film;
producing a multiplicity of tiny agglomerates of a first material on said semiconductive layer;
said agglomerates being spaced apart a distance substantially equal to said predetermined thickness;
filling the voids between said agglomerates with a metallic material to a depth less than the thickness of said agglomerates;
removing said agglomerates to leave said metallic material formed into a mesh-like grid;
heat treating said semiconductive layer;
applying silicone oil to the semiconductive layer at substantially the same time as the step of heat treating the semiconductor is performed;
depositing a second layer of semiconductive material on said grid of a thickness substantially greater than said predetermined thickness; and
depositing a second conductive film on said second semiconductive layer.

14. The method of claim 13 with the addition that said metallic material is deposited on said semiconductor after the steps of heat treating the semiconductor and applying silicone oil to the semiconductor have been performed.

15. The method of claim 13 with the addition that said metallic material is deposited on said semiconductor before the steps of heat treating the semiconductor and applying silicone oil to the semiconductor have been performed.

16. The method of claim 13 with the additional specification that said steps of heat treating the semiconductor and at the same time applying silicone oil to the semiconductor are performed by applying heated silicone oil to the semiconductor.

17. A method of embedding a thin film mesh-like structure made of a first material within a member made of a second material different from said first material, said method comprising:
providing a supporting layer made of said second material;
depositing a layer made of multiplicity of tiny agglomerates of a given material on said supporting layer;
depositing a layer of said first material so as to cover the areas of said supporting layer not covered by said agglomerates while exposing at least part of each one of said agglomerates;
removing said agglomerates from said supporting layer while leaving the layer of said first material intact as a mesh-like structure;
heat treating said semiconductive layer;
applying silicone oil to the semiconductive layer at substantially the same time as the step of heat treating the semiconductor is performed; and
covering said mesh-like structure and the interstices thereof with an additional layer of said second material.

18. A method of making a thin-film active element having a layer of metallic material in blocking contact with a layer of semiconductive material, including:
- applying said layer of metallic material to a selected surface of said layer of semiconductive material;
- applying silicone oil to said selected surface of said layer of semiconductive material; and
- heat treating said selected surface of said layer of semiconductive material in the presence of said silicone oil.

19. The method of claim 18 with the addition that said metallic material is deposited on said semiconductive material after the steps of heat treating the semiconductive material and applying silicone oil to the semiconductive material have been performed.

20. The method of claim 18 with the addition that said metallic material is deposited on said semiconductive material before the steps of heat treating the semiconductive material and applying silicone oil to the semiconductive material have been performed.

21. The method of claim 18 with the additional specification that said steps of heat treating the semiconductive material and at the same time applying silicone oil to the semiconductive material are performed by applying heat silicone oil to the semiconductive material.

References Cited

UNITED STATES PATENTS

| | | | |
|---|---|---|---|
| 2,610,386 | 9/1952 | Saslaw | 29—590 X |
| 2,916,806 | 12/1959 | Puduin | 29—590 |
| 2,948,642 | 8/1960 | MacDonald | 29—590 |
| 3,298,863 | 1/1967 | McCusker | 29—590 |

PAUL M. COHEN, Primary Examiner

U.S. Cl. X.R.

29—498, 590; 148—13